United States Patent [19]
Fawal et al.

[11] Patent Number: 5,793,260
[45] Date of Patent: Aug. 11, 1998

[54] CURRENT CONTROLLED OSCILLATOR WITH VOLTAGE INDEPENDENT CAPACITANCE

[75] Inventors: Marwan A. Fawal, Santa Clara; Burton B. Lo, San Francisco; Ruchi Wadhawan, Sunnyvale, all of Calif.

[73] Assignee: 3Com Corporation, Santa Clara, Calif.

[21] Appl. No.: 641,101

[22] Filed: Apr. 26, 1996

[51] Int. Cl.$^6$ ............................ H01G 9/048; H03L 7/085
[52] U.S. Cl. ................. 331/111; 331/143; 257/532; 257/306; 361/301.4; 361/306.3
[58] Field of Search ...................... 257/532, 306; 331/111, 143; 361/301.4, 305, 306.3

[56] References Cited

U.S. PATENT DOCUMENTS

| | | |
|---|---|---|
| 4,147,996 | 4/1979 | Gontowski, Jr. ............... 331/111 |
| 5,166,858 | 11/1992 | Frake et al. ............... 361/313 |
| 5,359,727 | 10/1994 | Kurita et al. ............... 395/550 |
| 5,418,751 | 5/1995 | Kaiser ............... 365/211 |
| 5,434,742 | 7/1995 | Saito et al. ............... 361/321.5 |
| 5,604,467 | 2/1997 | Mathews ............... 331/176 |

*Primary Examiner*—Timothy P. Callahan
*Assistant Examiner*—An T. Luu
*Attorney, Agent, or Firm*—Townsend and Townsend and Crew LLP; Kenneth R. Allen

[57] ABSTRACT

A current-controlled oscillator with first and second differential comparators (640, 840) serving as inputs, first and second voltage independent multi-layered integrated capacitors (600, 800) corresponding to the first and second comparators (640, 840), and a RS latch (700) for switching operation between the two comparators (640, 840) thereby achieving oscillation. The multi-layered integrated capacitors (600, 800) are designed to provide voltage independent capacitance.

19 Claims, 8 Drawing Sheets

CURRENT CONTROLLED OSCILLATOR WITH VOLTAGE INDEPENDENT CAPACITANCE

BACKGROUND OF THE INVENTION

The present invention relates to integrated circuits, and more specifically to a current-controlled oscillator which utilizes a voltage independent multi-layered capacitor to reduce jitter in its output frequency and achieve highly symmetrical duty cycles in its output waveform.

In the operation of an oscillator, it is generally desirable that the frequency (f) of the oscillator vary only with input current, as this will ensure good frequency control. Since current (i) approximately equals capacitance (C) multiplied by voltage across the capacitor (V) multiplied by f, if C and V remain substantially constant, f will vary substantially linearly with respect to i.

Figure 1:
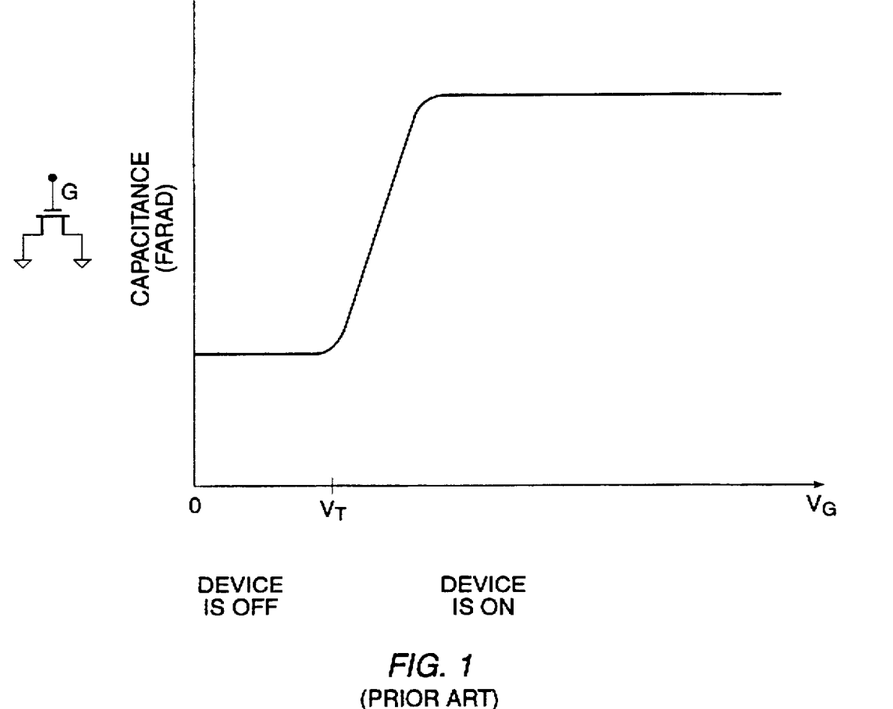
FIG. 1 shows the nonlinear capacitance behavior of a prior art gate capacitance of a MOSFET transistor with respect to gate voltage.

Existing current-controlled oscillators generally utilize gate-oxide capacitance ($C_{ox}$) of MOSFET transistors as capacitors, as $C_{ox}$ capacitors occupy a relatively small area on a circuit layout. However, as shown in FIG. 1, the capacitance of a $C_{ox}$ capacitor with respect to applied voltage is non-linear, and it is voltage dependent. Since its capacitance is not constant, an oscillator utilizing a $C_{ox}$ capacitor will experience jitter in its output frequency.

Figure 2:
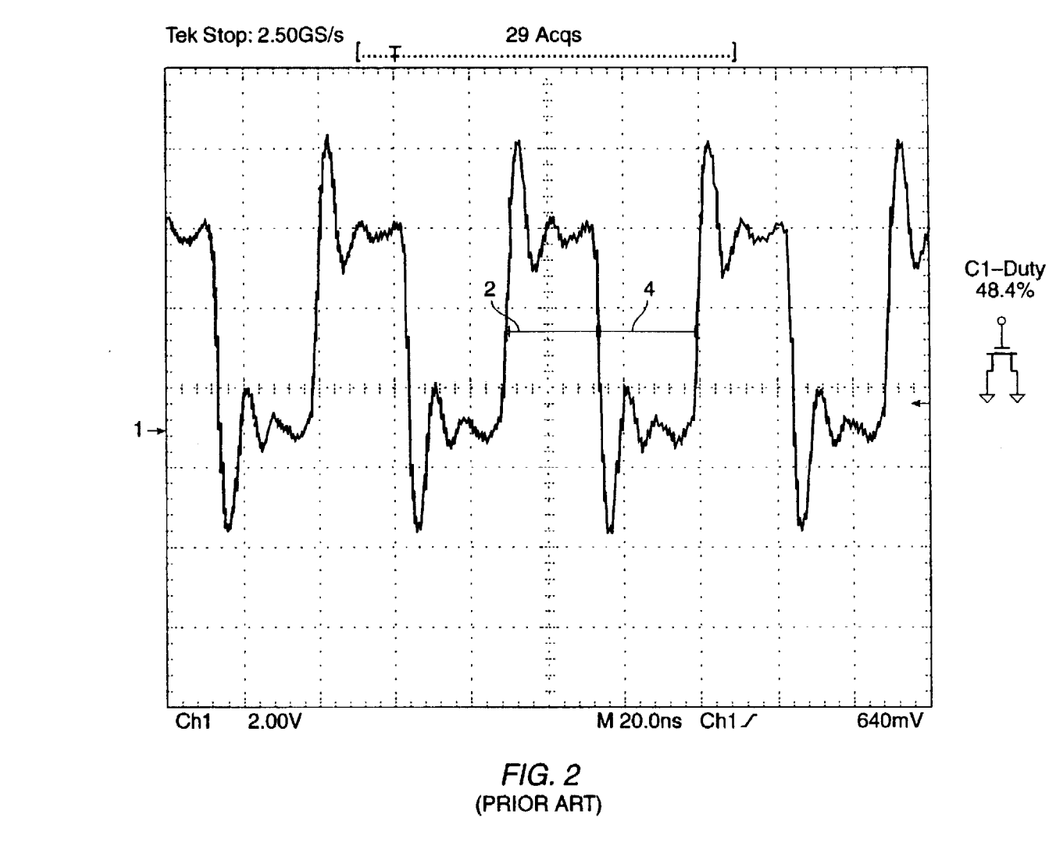
FIG. 2 shows asymmetrical duty cycles of the output waveform of a prior art oscillator utilizing a gate capacitance of a MOSFET transistor as capacitor.

Furthermore, an oscillator utilizing a $C_{ox}$ capacitor will have asymmetrical duty cycles in its output waveform. FIG. 2 shows the output waveform of an oscillator utilizing a $C_{ox}$ capacitor. Calculation of the duty cycle of the output waveform yields a value of 48.4 percent. Since the duty cycle is determined by dividing the high time of the output waveform by its period (which is the sum of the high time and the low time), this shows that the output waveform is not symmetrical.

SUMMARY OF THE INVENTION

The present invention solves the problem of the prior art by providing a method for reducing jitter due to varying frequency in the output frequency of an oscillator. The invention also provides an apparatus with highly symmetrical duty cycles in its output waveform, and reduced jitter in its output frequency.

In one aspect of the invention, a multi-layered voltage independent capacitor is utilized by a current-controlled oscillator fabricated on an integrated circuit substrate. The capacitor has a first metal layer, a second metal layer, and a polysilicon layer, and can be formed on top of a p-type or n-type substrate. The capacitance of the multi-layered capacitor is constant regardless of the voltage applied at the capacitor terminals. Hence, the output frequency of the oscillator varies only with input current, thereby reducing jitter in the output frequency of the oscillator.

In another aspect of the invention, the current-controlled oscillator has first and second differential comparators serving as inputs, first and second voltage independent multi-layered integrated capacitors corresponding to the first and second comparators, and a RS latch for switching operation between the two comparators thereby achieving oscillation. The voltage independent capacitors may be used in any CMOS fabrication process with multiple metalization layers. Although the voltage independent capacitors occupy a larger area on a circuit layout, additional metalization layers may be used to realize voltage independent capacitors with a smaller layout area. The capacitance of the voltage independent capacitors may also be increased or decreased as necessary.

Other features and advantages of the present invention will become apparent upon a perusal of the remaining portions of the specification and drawings. In the drawings, like reference numerals indicate identical or functionally similar elements.

DESCRIPTION OF THE PREFERRED EMBODIMENT

Figure 3:
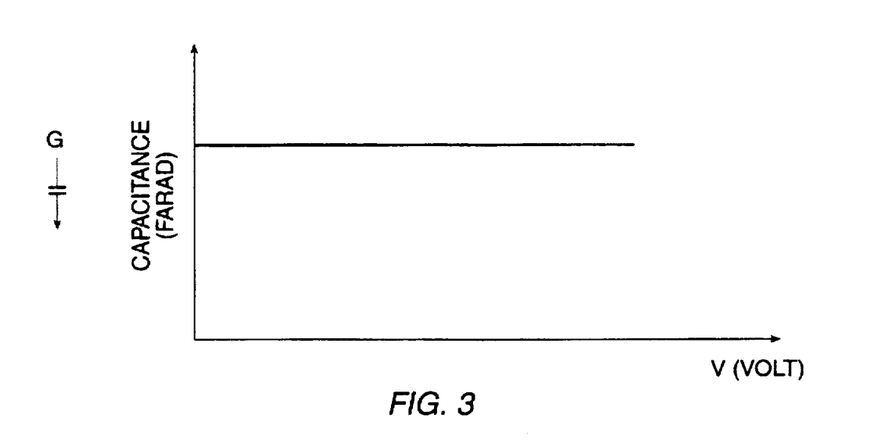
FIG. 3 shows the substantially linear capacitance behavior of a voltage independent multi-layered capacitor according to the present invention.

FIG. 3 shows the substantially linear capacitance behavior of a voltage independent multi-layered capacitor according to the present invention. As shown, the capacitance of the multi-layered capacitor is substantially constant regardless of the voltage applied across the capacitor. As previously discussed, an oscillator with a substantially constant capacitance has an output frequency which varies substantially linearly with respect to input current. Hence, a current-controlled oscillator utilizing a voltage independent capacitor substantially reduces jitters in its output frequency.

Figure 4:
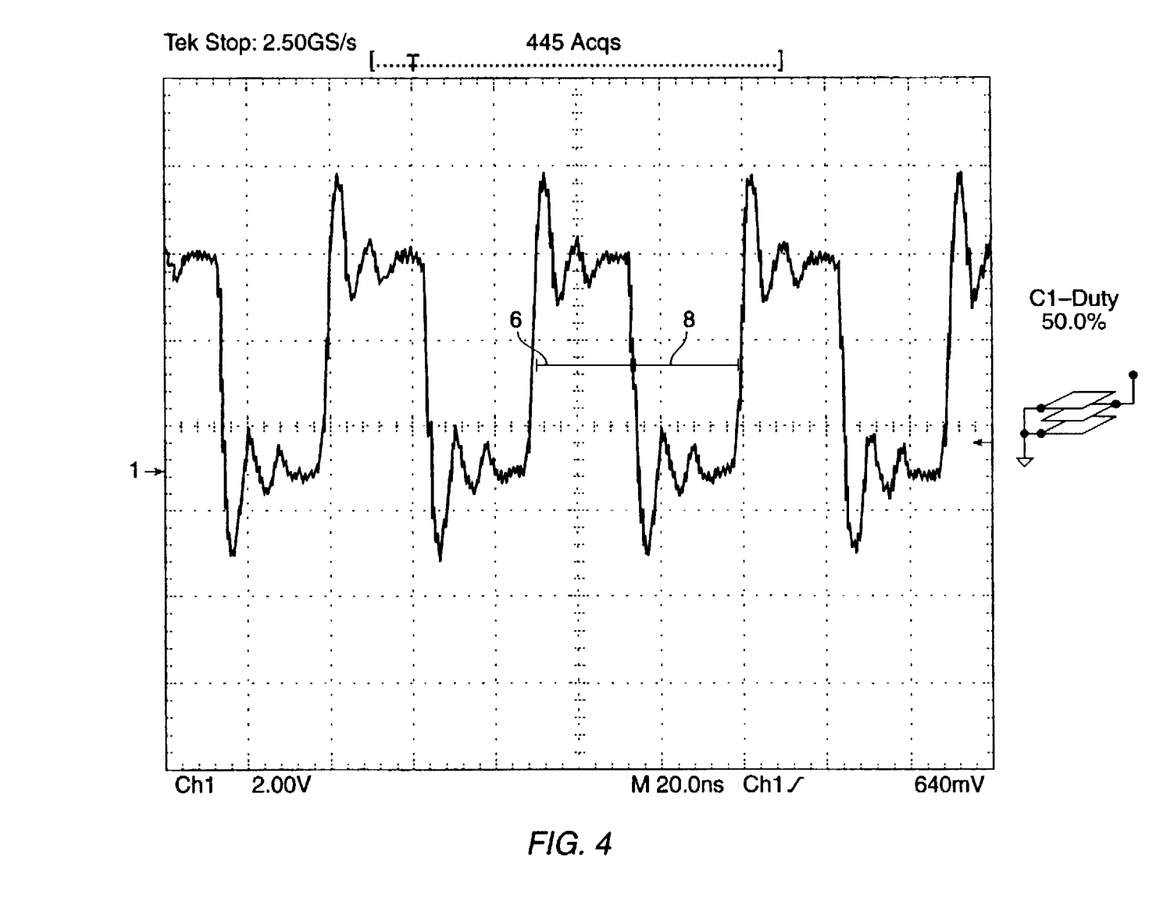
FIG. 4 shows symmetrical duty cycles of the output waveform of an oscillator utilizing a multi-layered voltage independent capacitor according to the present invention.

Furthermore, such a current-controlled oscillator has highly symmetrical duty cycles in its output waveform. FIG. 4 shows the output waveform of an oscillator using a multi-layered voltage independent capacitor according to the present invention. As indicated, the duty cycle of the output waveform is 50 percent. As previously discussed, the duty cycle of an output waveform is determined by dividing the high time of the output waveform by its period (which is the sum of the high time and the low time). A close examination of the prior art waveform shown in FIG. 2 shows that the high time 2 has a smaller value than the low time 4, hence, the duty cycle of the waveform is at 48.4 percent. On the other hand, a close examination of the FIG. 4 waveform shows that high time 6 and low time 8 are substantially equal, hence the duty cycle of the waveform is substantially symmetrical.

Figure 5:
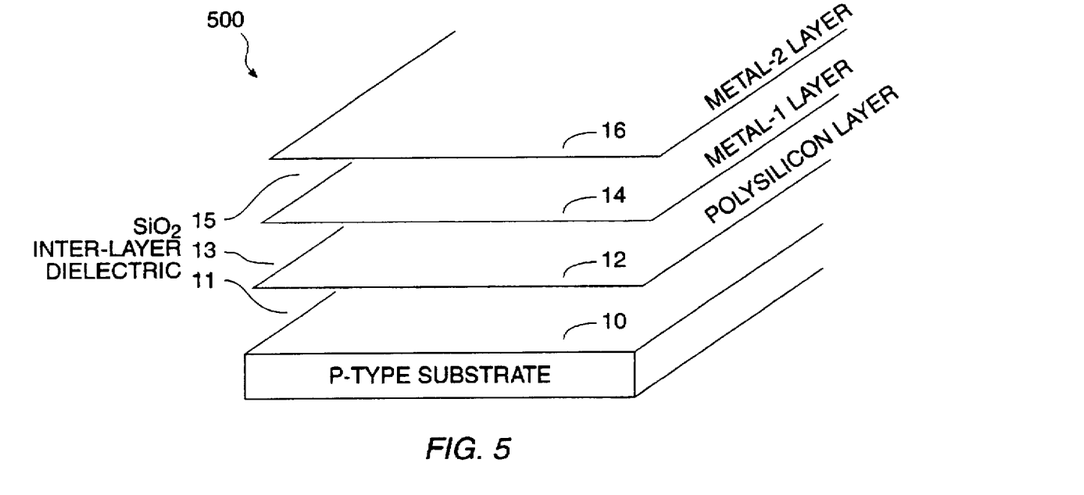
FIG. 5 shows a preferred construction of a multi-layered voltage independent capacitor according to the present invention.

FIG. 5 shows a preferred construction of voltage independent multi-layered capacitor 500 according to the present invention. As can be seen, capacitor 500 is formed on top of a p-type substrate 10 by first forming a polysilicon layer 12 on top of substrate 10. A first metal layer 14 is then formed on polysilicon layer 12, and a second metal layer 16 is formed on first metal layer 14. Silicon oxide dielectric layers 11, 13, and 15 are inter-layered between the polysilicon and metal layers, and the substrate, to separate the layers from each other and from the substrate. As previously mentioned, the capacitor could be formed on an n-type substrate. The construction of the capacitor would remain the same. The only difference in a p-type and an n-type construction is that the p-typed substrate is connected to ground, while the n-typed substrate is connected to Vdd.

Figure 6:
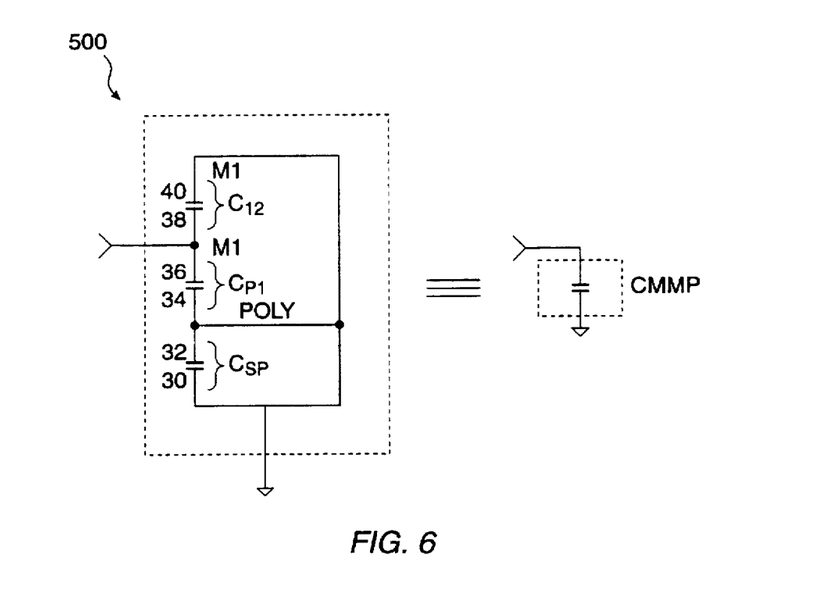
FIG. 6 shows a preferred schematic connection of the voltage independent multi-layered capacitor according to the present invention.

A preferred schematic connection of voltage independent multi-layered capacitor 500 is illustrated in FIG. 6. $C_{SP}$ corresponds to the capacitance between substrate 10 and polysilicon layer 12. $C_{P1}$ corresponds to the capacitance between polysilicon layer 12 and first metal layer 14, and $C_{12}$ corresponds to the capacitance between first metal layer 14, and second metal layer 16. As shown, the positive terminal is connected to plate 38 of $C_{12}$, and plate 36 of $C_{P1}$. Plate 34 of $C_{P1}$ is connected to plate 40 of $C_{12}$, plate 32 of $C_{SP}$, and the negative terminal. Plate 30 of $C_{SP}$ is also connected to plate 40 of $C_{12}$, plate 32 of $C_{SP}$, and the negative terminal; furthermore, it is connected to plate 34 of $C_{P1}$.

Figure 7:
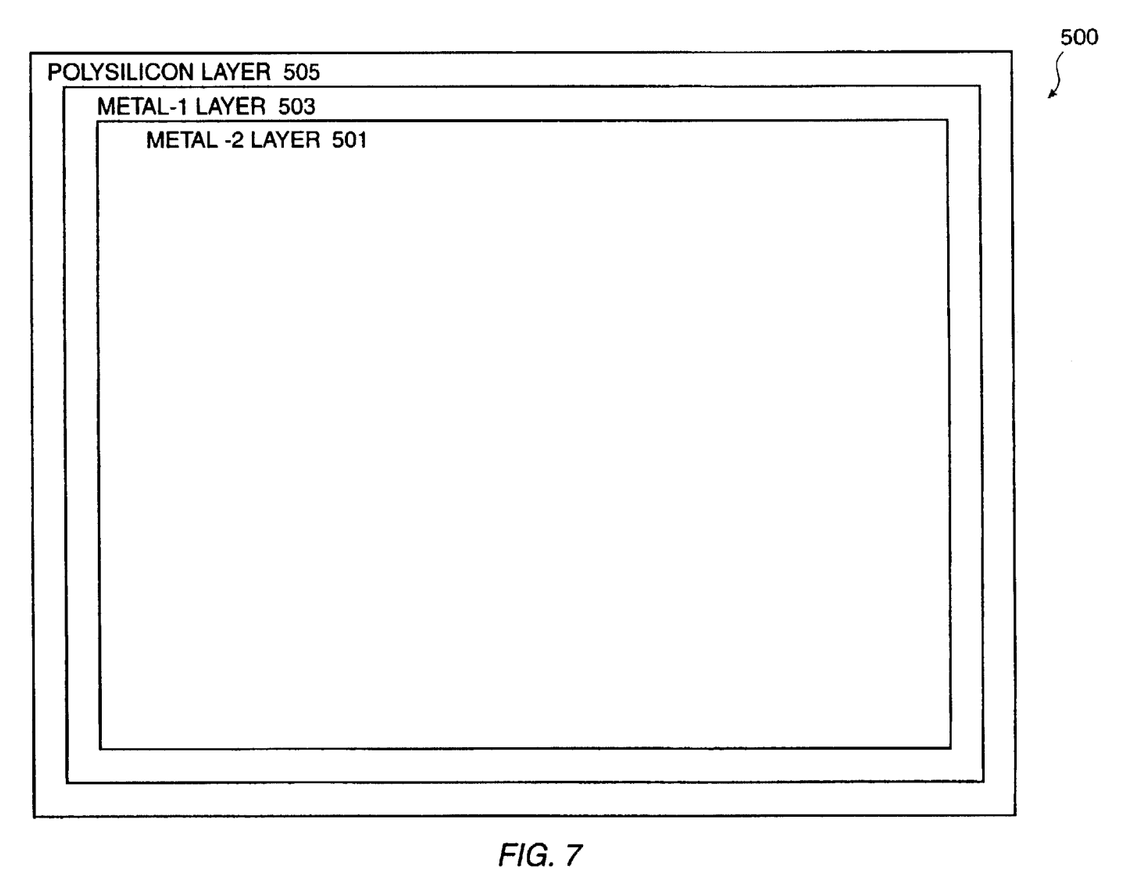
FIG. 7 shows a preferred layout of the voltage independent multi-layered capacitor according to the present invention.

FIG. 7 shows a preferred layout of voltage independent multi-layered capacitor 500 according to the present invention. Measurements are given for a specific embodiment as examples only, and capacitor 500 may have different dimensions. As shown in FIG. 7, the second metal layer 501 of capacitor 500 has the smallest area. It is laid over the first metal layer 503, which has an intermediate area. The polysilicon layer 505 is the largest of the three layers. The different areas of the layers allow for easy connection of the layers with different potentials.

As an example, the dimensions of the layers are a length of 72.4 micrometer with a width of 52.4 micrometer, a length of 76 micrometer with a width of 61 micrometer, and a length of 80 micrometer with a width of 65 micrometer for the second metal layer 501, the first metal layer 503, and the polysilicon layer 505, respectively. As an another example, a capacitor with smaller capacitance has dimensions of a length of 57.4 micrometer with a width of 27.4 micrometer, a length of 61 micrometer with a width of 31 micrometer, and a length of 65 micrometer with a width of 35 micrometer for the second metal layer 501, the first metal layer 503, and the polysilicon layer 505, respectively. These dimensions are provided only as examples of specific embodiments. It will be apparent to anyone of skill in the art that many other dimensions are possible.

Figure 8:
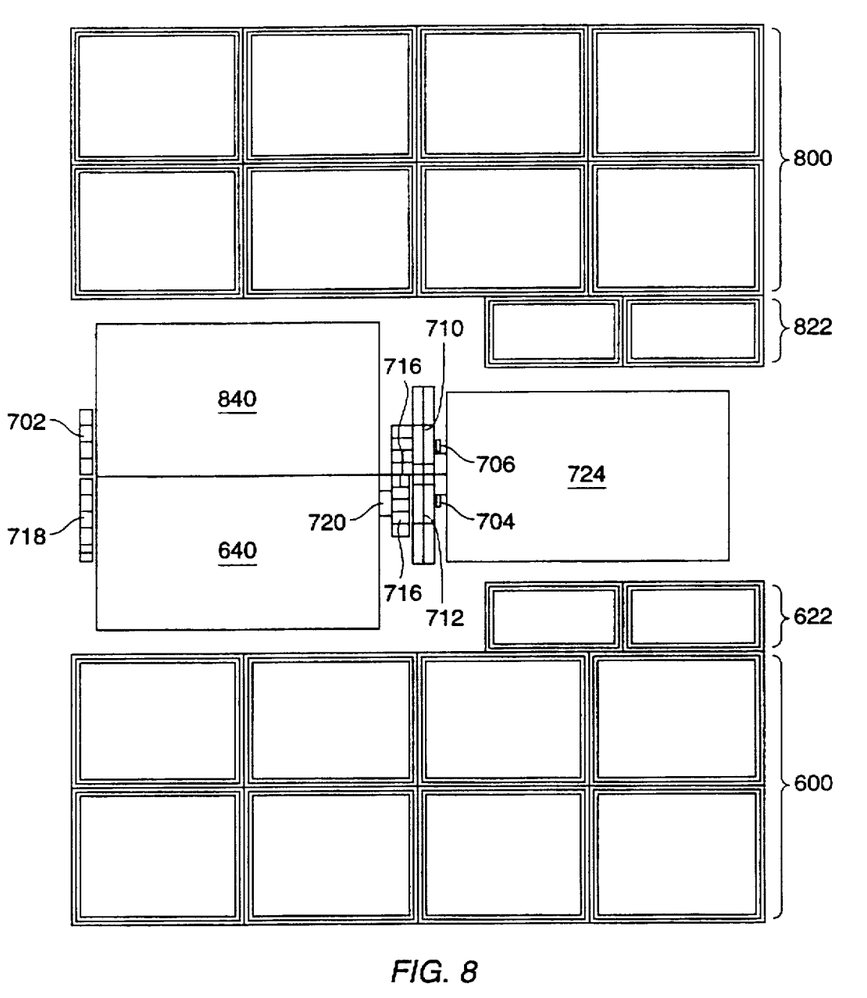
FIG. 8 shows a preferred layout of a differential voltage-controlled oscillator which utilizes the current-controlled oscillator according to the present invention.

FIG. 8 shows a preferred layout of a differential voltage-controlled oscillator which utilizes the current-controlled oscillator according to the present invention. As can be seen, the top and bottom half of the layout is symmetrical with respect to the components in the middle. On each symmetrical side, there are eight identical voltage independent multi-layered capacitors. Referring to the bottom symmetrical side, these eight identical 0.33745 picofarad capacitors are collectively denoted as 2.42 picofarad capacitor 600. In addition, there are two identical 0.13346 picofarad capacitors. These are collectively denoted as 0.266 picofarad capacitor 622.

The arrangement of the capacitors as shown in FIG. 8 allows the easy reduction or addition of capacitance during prototyping. Capacitor 622 is usually bypassed. However, if more capacitance is desired, one or both of the 0.13346 picofarad capacitors could be connected in parallel with capacitor 600 to increase the overall capacitance. In the alternative, one or more of the eight identical 0.33745 picofarad capacitors may be shaved off during prototyping to reduce the capacitance of capacitor 600.

Since capacitor 600 is multi-layered, it could be used in any CMOS fabrication process with multiple metalization layers. Although capacitor 600 comprises eight smaller capacitors, additional metalization layers can be used to construct a single capacitor which utilizes a smaller layout area.

Figure 9:
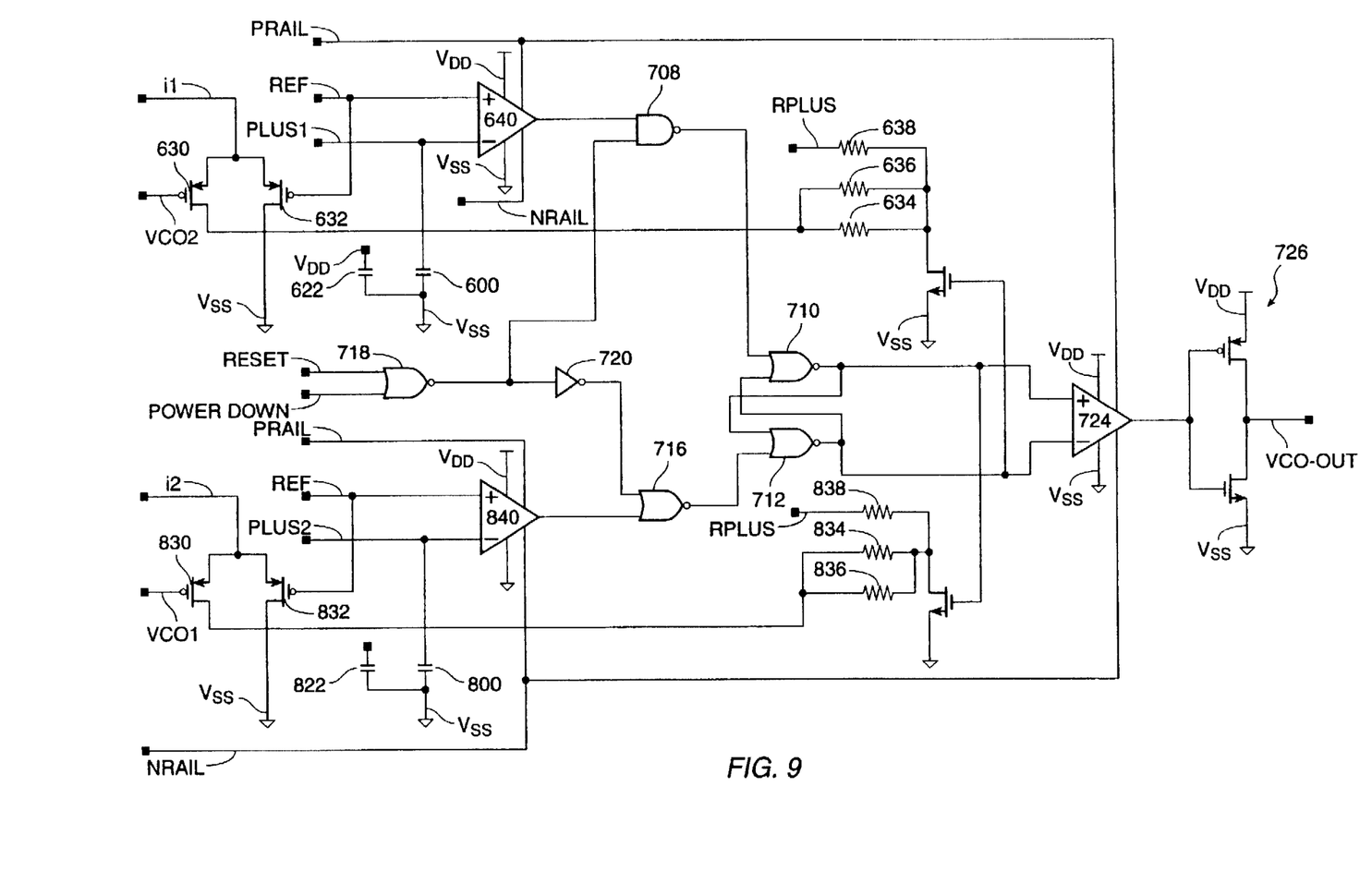
FIG. 9 shows the schematic circuit diagram corresponding to the layout of FIG. 8.

Block 702 of FIG. 8 corresponds to transistor pairs 630, 632 and 830, 832 of FIG. 9. Similarly, resistor block 704 corresponds to resistors 634, 636, and 638 of FIG. 9, while resistor block 706 corresponds to resistors 834, 836, and 838. These resistor blocks and the remaining components shown on FIG. 8 will be discussed with reference to FIG. 9, which shows the layout of FIG. 8 in a schematic diagram.

Referring to FIG. 9, transistor pair 630 and 632 function together as a selecting switch for steering input current $i_1$ either to ground or to charge capacitor 600. As mentioned, capacitor 622 may be connected in parallel with capacitor 600 to increase the capacitance, hence it may be charged as well if it is not bypassed. As capacitor 600 is charged, comparator 640's output will correspond to its negative input. This output serves as an input to NAND gate 708, whose output serves as an input to NOR gate 710.

NOR gates 710 and 712 function as a RS latch 714 which flips when capacitor 600 is charged so that capacitor 600 can discharge, while capacitor 800 can be charged. NAND gate 708, NOR gate 716, NOR gate 718, and inverter 720 are utilized to override the signal from either comparator 640 or comparator 840 to set or reset latch 714, thereby determining whether capacitor 600 or 800 will be charged. Resistors 634 and 636 provide the time constant at which capacitor 600 is discharged. Resistor 638 is optional, and may be connected in series or in parallel with resistors 634 and 636 depending on the capacitance discharge rate desired.

Since the circuit is symmetrical, resistors 834, 836, and 838 function in a similar manner as resistors 634, 636, and 638. Similarly, transistor pair 830 and 832 have functions corresponding to transistor pair 630 and 632. Comparator 724 functions to amplify the output signal, and provide for a faster transition time. Similarly, inverter 726 and additional buffers may be used to provide for a clearer signal swing to achieve faster transition time.

Figure 10:
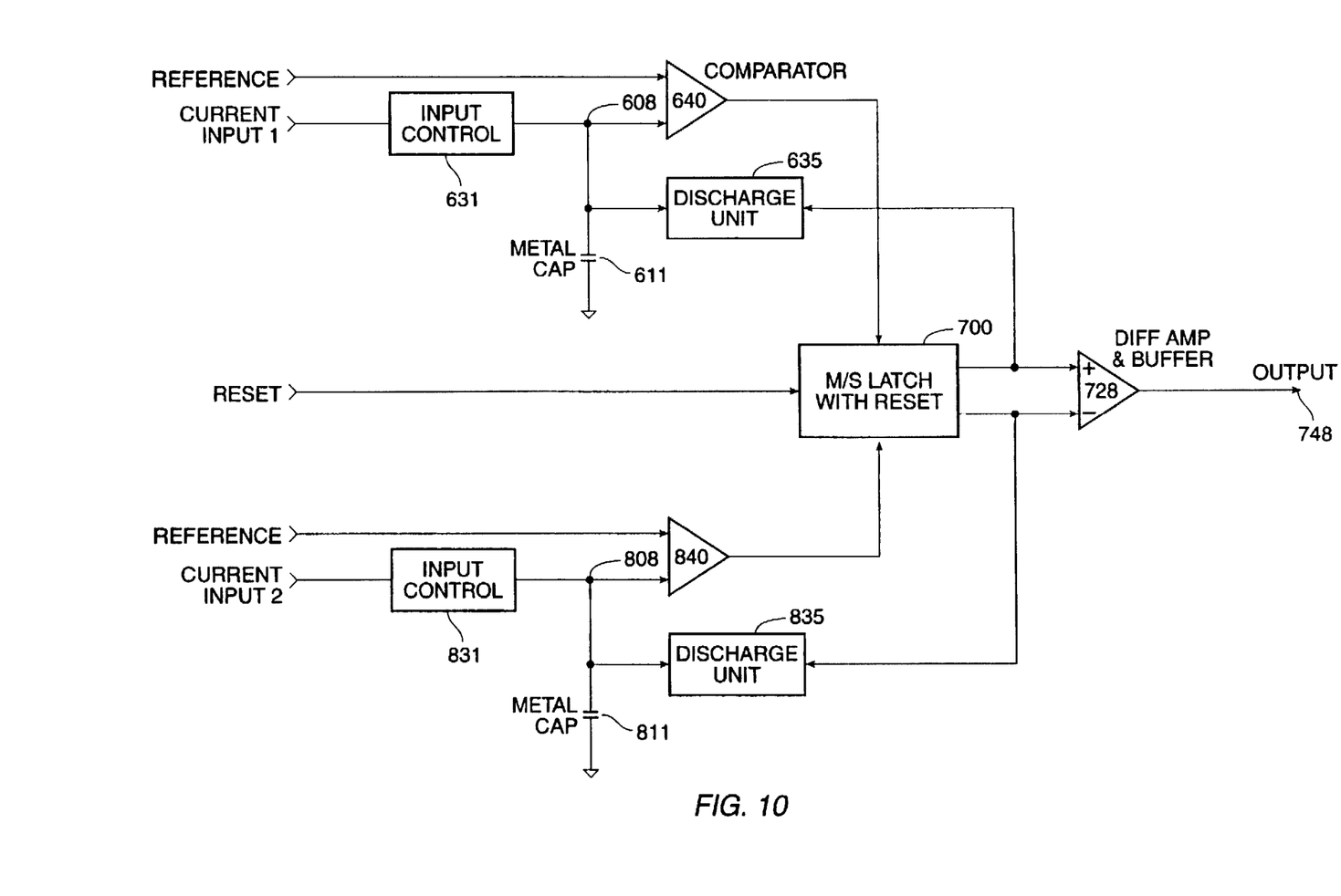
FIG. 10 shows the simplified schematic block diagram corresponding to the schematic circuit diagram of FIG. 9.

FIG. 10 shows the simplified schematic block diagram corresponding to the schematic circuit diagram of FIG. 9. Input control 631 corresponds to transistor pair 630 and 632. Similarly, input control 831 corresponds to transistor pair 830 and 832. Capacitor 611 corresponds to capacitor 600 and 622, while capacitor 811 corresponds to capacitor 800 and 822. Discharge unit 635 corresponds to resistors 634, 636, and 638. Likewise, discharge unit 835 corresponds to resistors 834, 836, and 838. "R/S Latch with Reset" 700 corresponds to NAND gate 708, inverter 720, NOR gates 710, 712, 716, and 718. Finally, "Diff Amp & Buffer" 728 corresponds to comparator 724 and invertor 726.

Comparators 640 and 840 function to detect when node voltage 608 or 808 reaches the reference voltage. For example, if the voltage at node 608 reaches the reference voltage, the output signal from comparator 640 will cause RS Latch 700 to turn on discharge unit 635, thereby allowing capacitor 611 to discharge. As discharge unit 635 is turned on, "Diff Amp and buffer" 728 will have an output corresponding to its positive terminal input, hence output 748 will be a logic high.

While capacitor 611 discharges, input control 831 is turned on to charge capacitor 811. When capacitor 811 is charged to the reference voltage, comparator 840 will send an output signal to RS Latch 700, which turns on discharge unit 835 to discharge capacitor 811. At the same moment, input control 631 is turned on to charge capacitor 611 to the reference voltage. As discharge unit 835 is turned on, "Diff Amp and buffer" 728 will have an output corresponding to its negative terminal input. In this case, output 748 will correspond to a logic low. By alternating the charging and discharging of capacitors 611 and 811, oscillation is achieved, as output 748 will oscillate between a logic high and a logic low depending on whether capacitor 611 or 811 is charging. As mentioned, "Diff Amp and buffer" 728 function to ensure a clearer signal swing thereby achieving a faster signal transition time.

The above description is illustrative and not restrictive. Variations of the invention will become apparent to those skilled in the art upon review of this disclosure. The scope of the invention should, therefore, be determined not with reference to the above description, but instead should be determined with reference to the appended claims along with their full scope of equivalents.

What is claimed is:

1. A current-controlled oscillator fabricated on an integrated circuit substrate, said current-controlled oscillator comprising:
   an input;
   an oscillator; and
   more than one capacitor, wherein the capacitance of said capacitors are voltage independent thereby allowing an input current of said input to control an output frequency of said oscillator.

2. The current-controlled oscillator of claim 1, wherein said input comprises first and second inputs, said first and second inputs having input currents, and wherein a difference of said input currents controls said output frequency of said oscillator.

3. The current-controlled oscillator of claim 1, wherein said voltage independent capacitors comprise multi-layered capacitors.

4. The current-controlled oscillator of claim 3, wherein said multi-layered capacitors each comprises:
   a polysilicon layer formed on a substrate;
   a first metal layer formed on said polysilicon layer; and
   a second metal layer formed on said first metal layer, wherein said polysilicon and metal layers are inter-layered with silicon oxide dielectric layers to separate said layers from each other and from said substrate.

5. The current-controlled oscillator of claim 4, wherein additional metalization layers may be utilized to construct a voltage independent capacitor with a smaller layout area.

6. The current-controlled oscillator of claim 4, wherein said first metal layer has a larger area than said second metal layer and said polysilicon layer has a larger area than said first metal layer to allow for easy connection of said layers to different potentials.

7. The current-controlled oscillator of claim 4, wherein said substrate is an n-type substrate.

8. The current-controlled oscillator of claim 4, wherein said substrate is a p-type substrate.

9. The current-controlled oscillator of claim 1, wherein said voltage independent capacitors are suitable for use in CMOS fabrication process with multiple metalization layers.

10. The current-controlled oscillator of claim 1 further comprising means for increasing or reducing the capacitance of each of said capacitors.

11. The current-controlled oscillator of claim 1 wherein each of said capacitors is formed as a plurality of independent capacitive units, said plurality of independent capacitive units comprises of optional and non-optional capacitive units, and wherein the capacitance of each of said capacitors may be increased during prototyping by connecting said optional capacitive units in parallel with said non-optional capacitive units.

12. The current-controlled oscillator of claim 1 wherein each of said capacitors is formed as a plurality of independent capacitive units, said plurality of independent capacitive units comprises of optional and non-optional capacitive units, and wherein the capacitance of each of said capacitors may be decreased during prototyping by shaving off portions of said non-optional capacitive units.

13. A current-controlled oscillator fabricated on an integrated circuit, said current-controlled oscillator comprising:
   first and second differential comparators as inputs, said inputs having input currents, wherein a difference of said input currents controls an oscillation rate of said current-controlled oscillator;
   first and second multi-layered integrated capacitors, wherein said first and second capacitors are designed to provide voltage independent capacitance;
   a RS latch for switching operation between said first and second differential comparators, thereby achieving oscillation; and
   wherein said multi-layered capacitor comprises a polysilicon layer formed on a substrate, a first metal layer formed on said polysilicon layer, and a second metal layer formed on said first metal layer, wherein said polysilicon and metal layers are inter-layered with silicon oxide dielectric layers to separate said layers from each other and from said substrate.

14. The current-controlled oscillator of claim 13, wherein said first metal layer has a larger area than said second metal layer and said polysilicon layer has a larger area than said first metal layer to allow for easy connection of said layers to different potentials, and wherein additional metalization layers may be utilized to reduce the areas of said first metal layer, said second metal layer, and said polysilicon layer.

15. The current-controlled oscillator of claim 13, wherein said substrate is an n-type substrate.

16. The current-controlled oscillator of claim 13, wherein said substrate is a p-type substrate.

17. The current-controlled oscillator of claim 13, wherein said voltage independent capacitor is suitable for use in CMOS fabrication process with multiple metalization layers.

18. The current-controlled oscillator of claim 13 wherein said multi-layered capacitors are each formed as a plurality of independent capacitive units, said plurality of independent capacitive units comprises of optional and non-optional capacitive units, and wherein the capacitance of said multi-layered capacitors may be increased during prototyping by connecting said optional capacitive units in parallel with said non-optional capacitive units.

19. The current-controlled oscillator of claim 18 wherein the capacitance of said multi-layered capacitors may be decreased during prototyping by shaving off portions of said non-optional capacitive unit.

* * * * *